United States Patent

Merrin

[15] 3,676,756

[45] July 11, 1972

[54] INSULATED GATE FIELD EFFECT DEVICE HAVING GLASS GATE INSULATOR

[72] Inventor: Seymour Merrin, Fairfield, Conn.

[73] Assignee: Innotech Corporation, Norwalk, Conn.

[22] Filed: Sept. 18, 1969

[21] Appl. No.: 859,012

[52] U.S. Cl. ....................317/235, 317/234

[51] Int. Cl. ....................H01l 11/14

[58] Field of Search ....................317/234, 21.1

[56] References Cited

UNITED STATES PATENTS

| | | | |
|---|---|---|---|
| 3,247,428 | 4/1966 | Perri et al. | 317/234 |
| 3,303,399 | 2/1967 | Hoogendoarn et al. | 317/234 |
| 3,368,024 | 2/1968 | Bishop | 174/52 |
| 3,505,106 | 4/1970 | Pliskin et al. | 117/201 |
| 3,535,133 | 10/1970 | Akhtar | 106/53 |
| 3,539,839 | 11/1970 | Igarashi | 318/331 |

*Primary Examiner*—James D. Kallam

*Attorney*—Pennie, Edmonds, Morton, Taylor and Adams

[57] ABSTRACT

An insulated gate field effect transistor having a glass gate insulator is fabricated by diffusing into a semiconductor substrate the impurities required to produce the channel, source and drain, exposing the substrate by etching away any remaining masking layer, forming a gate insulator of thin film ion impermeable glass on the exposed substrate and then metalizing and packaging the resulting device. Advantageously, the thin glass film is also used as a passivating layer. IGFET'S fabricated in this manner are significantly more resistant to contamination than are prior art devices using oxide insulated gates and passivating layers. As a consequence they are more economical to fabricate and more reliable in operation.

18 Claims, 5 Drawing Figures

INVENTOR
Seymour Merrin
BY Pennie, Edmonds, Morton, Taylor & Adams
ATTORNEYS

INVENTOR
Seymour Merrin
BY Pennie, Edmonds,
Morton, Taylor and Adams
ATTORNEYS

INSULATED GATE FIELD EFFECT DEVICE HAVING GLASS GATE INSULATOR

BACKGROUND OF THE INVENTION

The advent of thermally oxidized silicon brought with it an increase in the feasibility of fabricating insulated gate field effect transistors (IGFET'S). The result has been an intense research and development effort in this field. (See, for example, A. S. Grove, Physics and Technology of Semiconductor Devices, Wiley and Sons, 1967, P. 317). One of the reasons for this effort is the potential ease of fabrication. Fewer diffusion and photolithographic operations are required to form an IGFET than to form a conventional bipolar transistor. Moreover, it is possible to fabricate many IGFET devices simultaneously on the same substrate without having to perform a separate step to isolate them from each other as in the case of bipolar transistors. Consequently, IGFET'S are particularly promising for use in complex integrated circuits.

A typical IGFET is described by R. Edwards in "The Anatomy of IGFET'S," 46 Bell Laboratories Record 247 (Sept. 1968). It comprises, in essence, an n-doped semiconductor substrate — usually silicon — including a pair of elongated p-doped regions, referred to as the source and the drain, separated by a narrow channel region of the substrate. A thin film of insulating material — typically silicon dioxide — is disposed on the channel region, and separate metal electrodes are provided in contact with the source and the drain and upon the insulating layer above the channel. The electrode and the insulating layer are referred to as the gate electrode and the gate insulator, respectively. In operation, the current between the source and the drain is controlled by the voltage applied to the gate electrode.

The IGFET is typically fabricated using the well-known planar technique which utilizes thin layers of epitaxially grown silicon dioxide to mask the silicon substrate during the diffusion and metalization steps. In addition, silicon dioxide is used as the principal dielectric material for the gate insulator. One primary difficulty with IGFET'S formed by this technique, however, is that contaminants, such as sodium, can migrate rapidly through the open network structure of the oxide to the channel — especially when a bias voltage is applied. The result of such contamination — whether introduced during fabrication or subsequently — is a slow, continuous increase in the leakage current of the transistor. Consequently, IGFET devices must be fabricated in ultra-clean environments and subsequently kept free of contaminants, usually by hermetic packaging.

Various passivation techniques have been developed for the general purpose of protecting semiconductor surfaces, but none of these techniques have proved wholly satisfactory for the special requirements of gate insulation in reproducible, practical IGFET'S.

SUMMARY OF THE INVENTION

In accordance with the present invention, an IGFET device is provided having a gate insulator comprising a thin film of suitably composed glass which remains relatively stable even despite subsequent exposure to potential contaminants. Such an IGFET can be fabricated by diffusing into a semiconductor substrate, by conventional planar techniques, the impurities required to produce the source, the drain and the channel, exposing the substrate above the channel by etching away any remaining masking layer disposed thereupon, forming a thin film ion impermeable glass gate insulator, and then metalizing and packaging the device. The thin film glass gate insulator is preferably formed by depositing on the substrate a coating of ion impermeable glass, heating the glass until it is capable of flowing and, at the same time, rapidly spinning the substrate to produce sufficiently thin uniform glass film which is free of pinholes. Advantageously, the same thin glass film is also used to passivate the substrate.

BRIEF DESCRIPTION OF THE DRAWINGS

The advantages, nature and various additional features of the invention will appear more fully upon consideration of the illustrative embodiment now to be described in detail in connection with the accompanying drawings in which.

DETAILED DESCRIPTION

Figure 1:
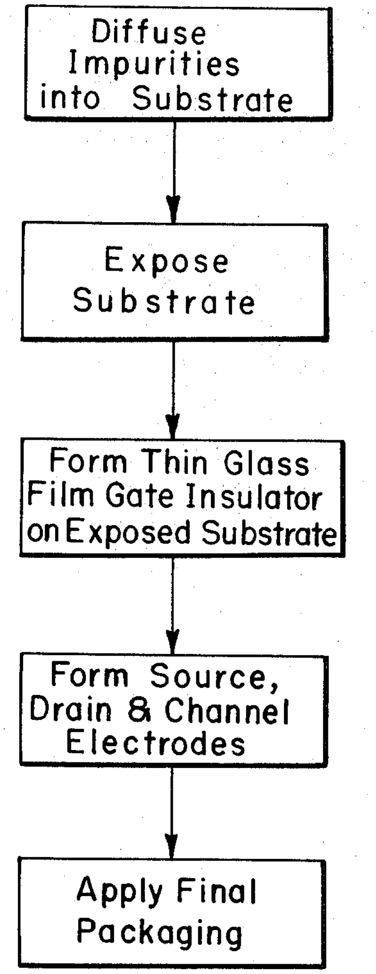
FIG. 1 is a flow diagram showing process steps for fabricating an IGFET device in accordance with the invention.
Figure 2A:
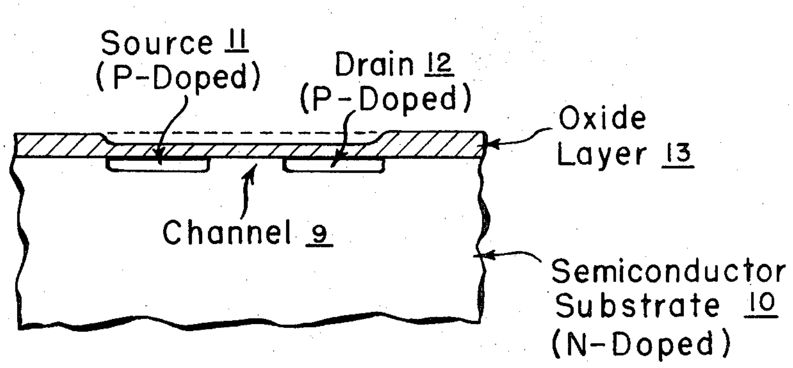
FIGS. 2A, 2B and 2C show schematic cross sections of an IGFET device at various stages in the fabrication process of FIG. 1.

Referring to the drawings, FIG. 1 is a flow diagram showing the steps involved in fabricating an IGFET in accordance with the invention. The first step involves diffusing impurities into a semiconductor substrate to form the channel, the source and the drain of an IGFET. This diffusion is advantageously carried out by the well-known planar technique on a standard single crystal wafer of silicon or germanium. A large number of devices — including devices other than IGFET'S — may thus be fabricated at the same time. The planar technique for producing IGFET'S is well-known and adequately described in the literature of the art. In essence, it involves lightly doping a semiconductor substrate with one type of impurity, e.g., n-type, epitaxially growing a layer of oxide on the doped substrate, selectively etching holes in the oxide where the source and the drain are to be formed, and diffusing impurities of the type opposite those previously used into the exposed substrate through the holes in the oxide mask. The diffusion depth, impurity concentrations and channel width can be carefully controlled to obtain the desired transistor characteristics in accordance with principles well-known in the art. FIG. 2A shows a portion of a wafer including an IGFET at this state of fabrication comprising an n-doped substrate 10, such as silicon doped with phosphorus, a source 11 and drain 12 formed by diffusing an acceptor impurity such as boron into the n-doped substrate. The source and the drain are separated by a channel region 9. An oxide layer 13 — the remnant of an earlier diffusion mask — is shown disposed upon the substrate.

The second step is exposing the semiconductor substrate above the channel by removing any of the remaining masking layer disposed thereupon. Silicon dioxide, for example, can be removed by etching the wafer in hydrofluoric acid. Advantageously the entire masking layer is removed.

The next step involves forming a gate insulator comprising a thin ionically impermeable film of glass on the exposed substrate. (A layer of material is defined herein as ionically impermeable if, in ordinary ambient conditions and at a temperature of 125° C., a capacitor biased at 10 volts using the film as a dielectric shows no significant shift in the capacitance voltage after a period of 100 hours.) In addition to being impermeable to the migration of ionic contaminants, the glass film should have a temperature coefficient of expansion compatible with the semiconductor so that the glass is not cracked by differential thermal expansion and contraction. For ease of fabrication, the glass film should have a softening temperature lower than the temperature at which diffused semiconductor devices will be damaged (i.e. typically less than 1000° C.).

With regard to the requirement of ion impermeability, it has been realized that because typical glass melts retain a degree of structure from the phases (compounds) from which they are formed, the glasses made predominantly from compositions of ionically impermeable crystalline phases will generally also be ionically impermeable. It has also been observed that phases which have as their main structural element a linear chain-like element, such as alkaline earth metasilicates, are generally ionically impermeable and cool to form ionically impermeable glasses. Typical common examples of such phases include $PbSiO_3$, $Pb_6Al_2Si_6O_{21}$, $ZnB_2O_4$, and $Zn_2SiO_4$. Glasses predominantly made up of mixtures of these phases are ionically impermeable. Generally, glasses comprising more than 50 mole per cent of such phases will be relatively good barriers to ionic contaminants, and glasses comprising 70 mole per cent or more are excellent barriers, even in the thin films required for gate insulators and high electrical component density integrated circuits. Certain additional components may be added to the phase in small quantities without destroying the impermeability of the resulting glass. These components fit into a silica site without significantly altering the glass structure. For example, $B_2O_3$ and $Al_2O_3$ may typically be added in quantities up to 20 mole per cent. They can be added, for example, to vary the softening temperature or coefficient of thermal expansion of the glass.

Among these glasses are the preferred glasses of the lead-boro-alumino-silicate, zinc-boro-silicate and zinc-boro-alumino-silicate families which, in addition to having the desired ionic impermeability, also have temperature coefficients of expansion comptaible with typical semiconductors and softening temperatures below the damage temperature for typical diffused semiconductor devices.

Because of their high dielectric constants, these glasses must be formed into extremely thin pinhole-free films, typically less than 3000 angstroms thick, in order to be useful as gate insulators. Insofar as is known, no technology has been heretofore developed for forming these materials in uniform films of sufficiently small thickness. For example the sedimentation technique described in U. S. Pat. No. 3,212,929 issued to W. A. Pliskin, et al. on Mar. 22, 1969 is only useful for forming a layer about 5000 angstroms thick. Moreover, since the surface so formed is irregular, supplementary etching is inadequate because even when the average thickness is properly adjusted, some areas will be either dangerously thin or totally removed. The glass film can be reglazed, correcting some of the defects, but the high degree of surface tension of glass films at temperatures near the softening point of the glass and the high viscosity prevent many of the holes or depressions from being healed.

Figure 3:
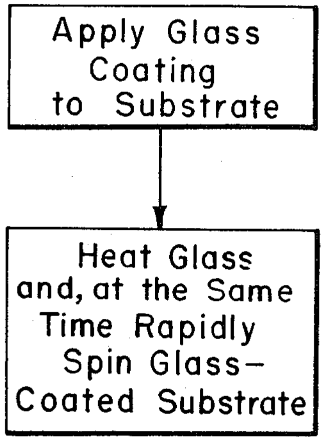
FIG. 3 is a flow diagram of a method for making a thin glass film useful in practicing the invention.

FIG. 3 is a flow diagram showing method steps for forming a thin glass film in accordance with a preferred embodiment of the invention. A thin glass coating, preferably having a thickness between 1.25 and 1.5 microns, is deposited on the exposed substrate by conventional techniques such as, for example, sedimentation or RF sputtering. For sedimentation depositions, the oxide components of the preferred glass composition are listed in Table 1. Below each listed preferred percentage is a range of acceptable percentages.

TABLE 1

| | | |
|---|---|---|
| $SiO_2$ | 6.6<br>(3–12) | mole percent |
| ZnO | 55.3<br>(45–65) | mole percent |
| PbO | 2.7<br>(0–6) | mole percent |
| $B_2O_3$ | 34.5<br>(25–40) | mole percent |
| $Al_2O_3$ | 1.0<br>(0–3) | mole percent |

where calcium oxide, barium oxide or strontium oxide or a mixture thereof can be substituted for ZnO in an amount up to 10 mole per cent. An alternative and satisfactory composition for a glass for sedimentation deposition is given in Table 2:

TABLE 2

| | | |
|---|---|---|
| $SiO_2$ | 60<br>(55–65) | mole percent |
| PbO | 35<br>(30–40) | mole percent |
| $Al_2O_3$ | 5<br>(0–7) | mole percent |

In the above composition $B_2O_3$ can be substituted for $SiO_2$ and ZnO can be substituted for PbO, each substitution being limited to under 20 mole per cent.

For RF sputtering deposition, the components for a preferred glass composition are listed in Table 3:

TABLE 3

| | | |
|---|---|---|
| $SiO_2$ | 43.15<br>(35–55) | mole percent |
| PbO | 43.15<br>(35–60) | mole percent |
| $Al_2O_3$ | 7.70<br>(0–20) | mole percent |

As in the previous composition, $B_2O_3$ can be substituted for $SiO_2$ and ZnO can be substituted for PbO in amounts up to 20 mole per cent. An alternative and satisfactory composition for a glass for either RF sputtering deposition or sedimentation is given in Table 4:

TABLE 4

| | | |
|---|---|---|
| $SiO_2$ | 10<br>(5–15) | mole percent |
| ZnO | 55.5<br>(50–65) | mole percent |
| $B_2O_3$ | 34.5<br>(25–35) | mole percent |

where calcium oxide, barium oxide, strontium oxide or a mixture thereof can be substituted for ZnO in amounts up to 10 mole per cent. In the above composition, PbO can be substituted for ZnO in amounts up to 20 mole per cent. These glasses can be formed in accordance with conventional techniques well-known in the prior art. (For preparing the glasses for sedimentation, see, for example, the technique used by W. A. Pliskin in U. S. Pat. No. 3,212,921 issued on Oct. 19, 1965.)

Figure 2B:
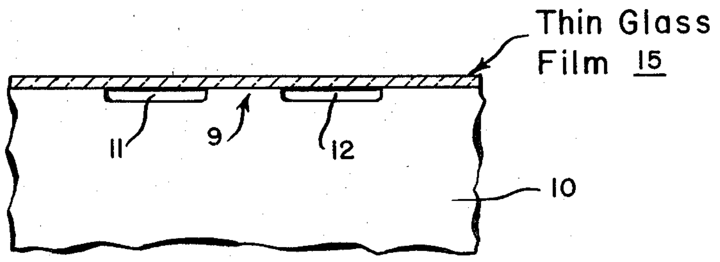

After deposition, the glass is then heated until it is capable of flowing, and the wafer is rapidly spun around its center to form a sufficiently thin uniform film. The glass may be heated, for example, by exposure to a resistance heater, hot gases or focused infra-red rays. The wafer can be spun by placing it on a rotatable spindle. The spindle can be protected from the required heat by covering it with a refractory ceramic. The thickness of the resulting glass film is dependent on the speed of rotation, and the viscosity and surface tension of the glass. The latter two parameters are dependent on specific glass composition and temperature. Hence all parameters are easily controlled during the fabrication process. For the preferred compositions previously described, a temperature of approximately 800° C and a rotational speed on the order of 10,000 r.p.m. are applied for a sufficient time to produce a pinhole-free film having an equilibrium thickness of less than 3000 angstroms. The structure with the thin glass film 15 applied to substrate 10 is shown in FIG. 2B.

In addition to being useful in the fabrication of IGFET'S, this method of depositing an ion impermeable thin glass film provides a method for filming extremely thin passivating layers, thus permitting higher etching resolution and, thus, greater compactness in the fabrication of various diffused junction semiconductor devices. For this purpose, glass films of less than 5000 angstroms of uniform thickness comprising 50 per cent or more of ionically impermeable phases will be sufficient, although the preferred embodiments are the same as those for the gate insulator. The gate insulator is defined by etching through glass film 15 to expose the source and the drain. Advantageously, the remaining glass on the surface is retained as a passivating layer.

Figure 2C:
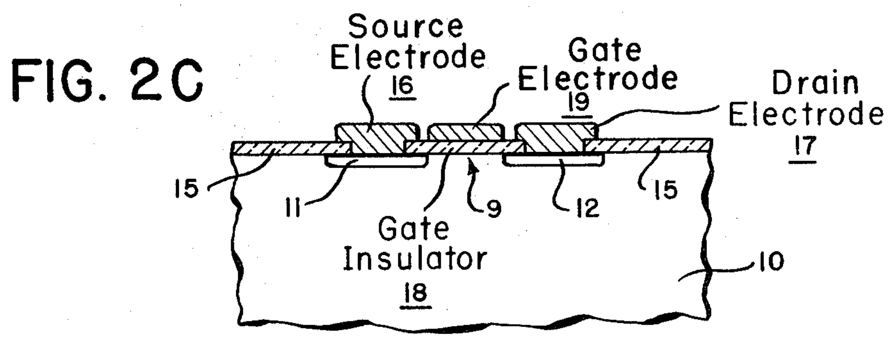

After the gate insulator is defined, metal electrodes and packaging are applied. These processes may be carried out according to techniques well-known in the art; however, the metalization need not be carried out — as was heretofore necessary — under the ultra-clean conditions. Fluxes can be used for soldering, and less expensive non"transistor grade" chemicals can be used for cleaning. In addition, since these devices are relatively insensitive to ambient conditions, non-hermetic packaging, such as plastic packaging, can be conveniently utilized. FIG. 2C shows the metalized IGFET, complete except for packaging. Source and drain electrodes 16 and 17 are shown in contact with the source 11 and drain 12, respectively; and the gate electrode 18 is shown disposed upon gate insulator 18 above channel region 9.

In addition to the advantage of greater stability in silicon IGFET'S, this technique can be used to fabricate IGFET'S in single element semiconductors such as germanium and intermetallic semiconductors such as gallium arsenide and zinc sulfide which do not form oxides that are useful for passivation. (Germanium oxide, for example, is more easily contaminated than $SiO_2$, has a low dielectric constant, and is hydroscopic.) Germanium IGFET'S are particularly advantageous because they have a much faster response time then similar silicon devices.

Another advantage of the technique is that it permits the simultaneous fabrication of IGFET'S and bipolar transistors on the same semiconductor surface. This fabrication on the same surface was heretofore very difficult because the large numbers of diffusions required to produce a bipolar transistor generally resulted in a sufficient concentration of impurities in the semiconductor that the dielectric properties of the oxide were too greatly deteriorated to permit its use as a gate insulator. Since, however, in accordance with the present technique, the oxide is removed and the glass insulator applied, the deterioration does not effect the IGFET.

I claim:

1. An insulated gate field effect transistor having a gate insulator comprising a thin film of glass made from 70 per cent or more of ionically impermeable crystalline phases.

2. A device according to claim 1 wherein said crystalline phases have, as their main structural element, a linear chain-like element.

3. A device according to claim 1 wherein said thin film of glass is less than 3000 angstroms thick.

4. A device according to claim 3 wherein said thin film of glass is made from one or more of the phases selected from the group consisting of $PbSiO_3$, $Pb_6Al_2Si_6O_{21}$, $ZnB_2O_4$ and $ZnSiO_4$.

5. A device according to claim 3 wherein said thin film of glass is a glass having a temperature coefficient of expansion compatible with the semiconductor substrate of the transistor and a softening temperature below the damage temperature of diffused semiconductor elements of the transistor.

6. A device according to claim 5 wherein said semiconductor substrate is germanium.

7. A device according to claim 5 wherein said semiconductor substrate is an intermettalic semiconductor.

8. A device according to claim 5 wherein said glass is selected from the group consisting of lead-alumino-silicate, lead-boro-alumino-silicate, zinc-boro-silicate and zinc-boro-alumino-silicate.

9. An insulated gate field effect transistor comprising a thin film of glass made from the following components in the following mole percentage ranges:

| | | |
|---|---|---|
| $SiO_2$ | 3–12 | mole percent |
| ZnO | 45–65 | mole percent |
| PbO | 0–6 | mole percent |
| $B_2O_3$ | 25–40 | mole percent |
| $Al_2O_3$ | 0–3 | mole percent |

wherein CaO, BaO, SrO or a mixture thereof can be substituted for ZnO in an amount up to 10 mole per cent.

10. An insulated gate field effect transistor having a gate insulator comprising a thin film of glass made from the following components in the following mole percentage ranges:

| | | |
|---|---|---|
| $SiO_2$ | 55–65 | mole percent |
| PbO | 30–40 | mole percent |
| $Al_{2O3}$ | 0–7 | mole percent |

wherein $B_2O_3$ can be substituted for $SiO_2$ in amounts up to 20 mole per cent, and ZnO can be substituted for PbO in amounts up to 20 mole per cent.

11. An insulated gate field effect transistor having a gate insulator comprising a thin film of glass made from the following components in the following mole percentage ranges:

| | | |
|---|---|---|
| $SiO_2$ | 35–55 | mole percent |
| PbO | 35–60 | mole percent |
| $Al_2O_3$ | 0–20 | mole percent |

wherein $B_2O_3$ can be substituted for $SiO_2$ in amounts up to 20 mole per cent, and ZnO can be substituted for PbO in amounts up to 20 mole per cent.

12. An insulated gate field effect transistor having a gate insulator comprising a thin film of glass made from the following components in the following mole percentage ranges:

| | | |
|---|---|---|
| $SiO_2$ | 5–15 | mole percent |
| ZnO | 50–65 | mole percent |
| $B_2O_3$ | 25–35 | mole percent |

wherein CaO, BaO, SrO or a mixture thereof can be substituted for ZnO in an amount up to 10 mole per cent and PbO can be substituted for ZnO in amounts up to 20 mole per cent.

13. A passivated semiconductor device comprising a semiconductor device having disposed thereon a thin film of glass having a thickness of less than 5000 angstroms made from 50 per cent or more of ionically impermeable crystalline phases.

14. A passivated semiconductor device according to claim 13 wherein said glass is selected from the group consisting of lead-alumino-silicate, lead-boro-alumino-silicate, zinc-boro-silicate and zinc-boro-alumino-silicate.

15. A passivated semiconductor device comprising a semiconductor substrate having disposed thereupon a thin film of glass comprising the following components in substantially the following mole percentage ranges:

| | | |
|---|---|---|
| $SiO_2$ | 3–13 | mole percent |
| ZnO | 45–65 | percent |
| ( | 0–6 | mole percent |
| $B_2O_3$ | 25–40 | mole percent |
| $Al_2O_3$ | 0–3 | mole percent. |

16. A passivated semiconductor device comprising a semiconductor substrate having disposed thereupon a thin film of glass comprising the following components in substantially the following mole percentage ranges:

| | | |
|---|---|---|
| $SiO_2$ | 55–65 | mole percent |
| PbO | 30–40 | mole percent |
| $Al_2O_3$ | 0–7 | mole percent. |

17. A passivated semiconductor device comprising a semiconductor substrate having disposed thereupon a thin film of glass comprising the following components in substantially the following mole percentage ranges:

| | | |
|---|---|---|
| $SiO_2$ | 35–55 | mole percent |
| PbO | 35–60 | mole percent |
| $Al_2O_3$ | 0–20 | mole percent. |

18. A passivated semiconductor device comprising a semiconductor substrate having disposed thereupon a thin film of glass comprising the following components in substantially the following mole percentage ranges:

| | | |
|---|---|---|
| $SiO_2$ | 5–15 | mole percent |
| ZnO | 50–65 | mole percent |
| $B_2O_3$ | 25–35 | mole percent. |

* * * * *

PO-1050
(5/69)

UNITED STATES PATENT OFFICE
CERTIFICATE OF CORRECTION

Patent No. 3,676,756 Dated July 11, 1972

Inventor(s) Seymour Merrin

It is certified that error appears in the above-identified patent and that said Letters Patent are hereby corrected as shown below:

Column 2, line 37, "state" should read --stage--.

Column 3, line 19, "comptaible" should read --compatible--.

Column 4, line 56, "filming" should read --forming--.

Column 6, line 42, "percent" should read --mole percent--.

Column 6, line 43, "(" should read --PbO--.

Signed and sealed this 9th day of January 1973.

(SEAL)
Attest:

EDWARD M. FLETCHER, JR.
Attesting Officer

ROBERT GOTTSCHALK
Commissioner of Patents